US008432693B2

(12) United States Patent
Jones et al.

(10) Patent No.: US 8,432,693 B2
(45) Date of Patent: Apr. 30, 2013

(54) HIGH POWER BAND PASS RF FILTER HAVING A GAS TUBE FOR SURGE SUPPRESSION

(75) Inventors: Jonathan L. Jones, Carson City, NV (US); Louis Ki Won Chang, Carson City, NV (US)

(73) Assignee: Transtector Systems, Inc., Hayden, ID (US)

( * ) Notice: Subject to any disclaimer, the term of this patent is extended or adjusted under 35 U.S.C. 154(b) by 250 days.

(21) Appl. No.: 13/101,089

(22) Filed: May 4, 2011

(65) Prior Publication Data

US 2011/0273845 A1 Nov. 10, 2011

Related U.S. Application Data

(60) Provisional application No. 61/331,292, filed on May 4, 2010.

(51) Int. Cl.
*H05K 7/20* (2006.01)
*H03H 7/01* (2006.01)

(52) U.S. Cl.
USPC .......................................... 361/699; 333/185

(58) Field of Classification Search ........................ None
See application file for complete search history.

(56) References Cited

U.S. PATENT DOCUMENTS

| | | | |
|---|---|---|---|
| 2,030,179 | A | 2/1936 | Potter |
| 3,167,729 | A | 1/1965 | Hall |
| 3,323,083 | A | 5/1967 | Ziegler |
| 3,619,721 | A | 11/1971 | Westendorp |
| 3,663,901 | A | 5/1972 | Forney, Jr. |
| 3,731,234 | A | 5/1973 | Collins |
| 3,750,053 | A | 7/1973 | LeDonne |
| 3,783,178 | A | 1/1974 | Philibert |
| 3,831,110 | A | 8/1974 | Eastman |
| 3,845,358 | A | 10/1974 | Anderson et al. |
| 3,944,937 | A | 3/1976 | Fujisawa et al. |
| 3,980,976 | A | 9/1976 | Tadama et al. |
| 4,046,451 | A | 9/1977 | Juds et al. |
| 4,047,120 | A | 9/1977 | Lord et al. |
| 4,112,395 | A | 9/1978 | Seward |
| 4,262,317 | A | 4/1981 | Baumbach |
| 4,359,764 | A | 11/1982 | Block |

(Continued)

FOREIGN PATENT DOCUMENTS

| | | | |
|---|---|---|---|
| CH | 675933 | A5 | 11/1990 |
| JP | 11-037400 | | 2/1999 |

(Continued)

*Primary Examiner* — Gregory Thompson
(74) *Attorney, Agent, or Firm* — Snell & Wilmer LLP

(57) ABSTRACT

A high power band pass RF filtering device having a housing for containing a printed circuit board with filtering components for achieving strong attenuation of out-of-band signals. An input port and an output port on the housing electrically connect to a respective input node and output node on the printed circuit board. Surge protection elements are connected at the input port and at the output port for dissipating surge conditions present at the input port or the output port to the housing before the surge travels through the printed circuit board. A non-surge signal present on the input port can travel through the filtering components on the printed circuit board towards the output port. An oil or other fluid is disposed and completely contained within the housing and contacts the printed circuit board for cooling the printed circuit board or the filtering components.

20 Claims, 14 Drawing Sheets

U.S. PATENT DOCUMENTS

| | | | |
|---|---|---|---|
| 4,384,331 | A | 5/1983 | Fukuhara et al. |
| 4,409,637 | A | 10/1983 | Block |
| 4,481,641 | A | 11/1984 | Gable et al. |
| 4,554,608 | A | 11/1985 | Block |
| 4,563,720 | A | 1/1986 | Clark |
| 4,586,104 | A | 4/1986 | Standler |
| 4,689,713 | A | 8/1987 | Hourtane et al. |
| 4,698,721 | A | 10/1987 | Warren |
| 4,727,350 | A | 2/1988 | Ohkubo |
| 4,952,173 | A | 8/1990 | Peronnet et al. |
| 4,984,146 | A | 1/1991 | Black et al. |
| 4,985,800 | A | 1/1991 | Feldman et al. |
| 5,053,910 | A | 10/1991 | Goldstein |
| 5,057,964 | A | 10/1991 | Bender et al. |
| 5,102,818 | A | 4/1992 | Paschke et al. |
| 5,122,921 | A | 6/1992 | Koss |
| 5,124,873 | A | 6/1992 | Wheeler et al. |
| 5,142,429 | A | 8/1992 | Jaki |
| 5,166,855 | A | 11/1992 | Turner |
| 5,278,720 | A | 1/1994 | Bird |
| 5,321,573 | A | 6/1994 | Person et al. |
| 5,353,189 | A | 10/1994 | Tomlinson |
| 5,442,330 | A | 8/1995 | Fuller et al. |
| 5,537,044 | A | 7/1996 | Stahl |
| 5,617,284 | A | 4/1997 | Paradise |
| 5,625,521 | A | 4/1997 | Luu |
| 5,667,298 | A | 9/1997 | Musil et al. |
| 5,721,662 | A | 2/1998 | Glaser et al. |
| 5,781,844 | A | 7/1998 | Spriester et al. |
| 5,790,361 | A | 8/1998 | Minich |
| 5,844,766 | A | 12/1998 | Miglioli et al. |
| 5,854,730 | A | 12/1998 | Mitchell et al. |
| 5,953,195 | A | 9/1999 | Pagliuca |
| 5,966,283 | A | 10/1999 | Glaser et al. |
| 5,982,602 | A | 11/1999 | Tellas et al. |
| 5,986,869 | A | 11/1999 | Akdag |
| 6,054,905 | A | 4/2000 | Gresko |
| 6,060,182 | A | 5/2000 | Tanaka et al. |
| 6,061,223 | A | 5/2000 | Jones et al. |
| 6,086,544 | A | 7/2000 | Hibner et al. |
| 6,115,227 | A | 9/2000 | Jones et al. |
| 6,137,352 | A | 10/2000 | Germann |
| 6,141,194 | A | 10/2000 | Maier |
| 6,177,849 | B1 | 1/2001 | Barsellotti et al. |
| 6,236,551 | B1 | 5/2001 | Jones et al. |
| 6,243,247 | B1 | 6/2001 | Akdag et al. |
| 6,252,755 | B1 | 6/2001 | Willer |
| 6,281,690 | B1 | 8/2001 | Frey |
| 6,292,344 | B1 | 9/2001 | Glaser et al. |
| 6,342,998 | B1 | 1/2002 | Bencivenga et al. |
| 6,381,283 | B1 | 4/2002 | Bhardwaj et al. |
| 6,385,030 | B1 | 5/2002 | Beene |
| 6,394,122 | B1 | 5/2002 | Sibley et al. |
| 6,421,220 | B2 | 7/2002 | Kobsa |
| 6,502,599 | B1 | 1/2003 | Sibley et al. |
| 6,527,004 | B1 | 3/2003 | Sibley et al. |
| 6,721,155 | B2 | 4/2004 | Ryman |
| 6,754,060 | B2 | 6/2004 | Kauffman |
| 6,757,152 | B2 | 6/2004 | Galvagni et al. |
| 6,785,110 | B2 | 8/2004 | Bartel et al. |
| 6,789,560 | B1 | 9/2004 | Sibley et al. |
| 6,814,100 | B1 | 11/2004 | Sibley et al. |
| 6,968,852 | B1 | 11/2005 | Sibley |
| 6,975,496 | B2 | 12/2005 | Jones et al. |
| 7,082,022 | B2 | 7/2006 | Bishop |
| 7,104,282 | B2 | 9/2006 | Hooker et al. |
| 7,106,572 | B1 | 9/2006 | Girard |
| 7,130,103 | B2 | 10/2006 | Murata |
| 7,159,236 | B2 | 1/2007 | Abe et al. |
| 7,221,550 | B2 | 5/2007 | Chang et al. |
| 7,250,829 | B2 | 7/2007 | Namura |
| 7,430,103 | B2 | 9/2008 | Kato |
| 7,623,332 | B2 | 11/2009 | Frank et al. |
| 7,729,118 | B2 * | 6/2010 | Lai et al. ........................ 361/699 |
| 7,753,662 | B2 * | 7/2010 | Lai et al. .................... 417/423.9 |
| 7,808,752 | B2 | 10/2010 | Richiuso et al. |
| 8,228,656 | B2 * | 7/2012 | Kauffman ..................... 361/118 |
| 2002/0167302 | A1 | 11/2002 | Gallavan |
| 2002/0191360 | A1 | 12/2002 | Colombo et al. |
| 2003/0072121 | A1 * | 4/2003 | Bartel et al. .................. 361/119 |
| 2003/0211782 | A1 | 11/2003 | Esparaz et al. |
| 2004/0121648 | A1 | 6/2004 | Voros |
| 2004/0145849 | A1 | 7/2004 | Chang et al. |
| 2004/0264087 | A1 | 12/2004 | Bishop |
| 2005/0036262 | A1 * | 2/2005 | Siebenthall et al. .......... 361/118 |
| 2005/0044858 | A1 | 3/2005 | Hooker et al. |
| 2005/0052844 | A1 * | 3/2005 | McCollum et al. ........... 361/689 |
| 2005/0104685 | A1 * | 5/2005 | Kuroki et al. ................. 333/133 |
| 2005/0176275 | A1 | 8/2005 | Hoopes et al. |
| 2005/0185354 | A1 | 8/2005 | Hoopes |
| 2006/0146458 | A1 | 7/2006 | Mueller |
| 2007/0053130 | A1 | 3/2007 | Harwath |
| 2007/0139850 | A1 | 6/2007 | Kamel et al. |
| 2009/0103226 | A1 | 4/2009 | Penwell et al. |
| 2009/0109584 | A1 * | 4/2009 | Jones et al. ..................... 361/56 |
| 2009/0284888 | A1 | 11/2009 | Bartel et al. |
| 2011/0080683 | A1 | 4/2011 | Jones et al. |
| 2011/0141646 | A1 | 6/2011 | Jones et al. |
| 2011/0159727 | A1 | 6/2011 | Howard et al. |
| 2012/0068789 | A1 * | 3/2012 | Jones et al. ................... 333/185 |

FOREIGN PATENT DOCUMENTS

| | | |
|---|---|---|
| KR | 1020090018497 | 2/2009 |
| WO | WO 9510116 | 4/1995 |
| WO | PCT/US03/17050 | 5/2003 |
| WO | WO 2011-119723 | 12/2011 |

* cited by examiner

HIGH POWER BAND PASS RF FILTER HAVING A GAS TUBE FOR SURGE SUPPRESSION

CROSS REFERENCE TO RELATED APPLICATIONS

This application claims the benefit and priority of U.S. Provisional Application No. 61/331,292, filed on May 4, 2010, the entire contents of which are hereby incorporated by reference herein.

BACKGROUND

1. Field

The present invention relates generally to band pass RF filters and improvements thereof. More particularly, the invention relates to high power band pass RF filters with surge protection elements and improvements thereof.

2. Description of the Related Art

Band pass RF filters for use in electronic circuits or between systems or devices are known and used in the art. In-line RF filter devices are similarly known and used in the art. Often in electrical systems, it is desirable to control signal frequencies to a desired range of frequency values. Band pass filters can be used for such purposes by rejecting or attenuating frequencies outside the desired range. In-line band pass filter devices connected along a conductive path between a source and a connecting system will only pass the desired range of frequencies to the connecting system. Signal frequencies outside of the desired range would ideally be highly attenuated. A band pass filter should have as flat of a pass-band as possible so passed signals experience little to no attenuation. A band pass filter should also transition from the pass-band to outside the pass-band with a sharp roll-off, narrow in frequency, to limit the passing of partially attenuated signal frequencies existing outside the pass-band.

As systems and electronics increase in complexity and size, power requirements can increase as well. Even in simple systems or devices, large amounts of power may be required or transmitted along signal wires or transmission cables. Operating frequency requirements are often still present in such systems, illustrating the need for frequency filtering devices capable of operating at these increased power levels. Surge events, particularly in such high power applications, necessitate additional considerations since the filtering electronics may be subjected to significant over-voltage or over-current conditions. Thus, an ideal electronic filtering device for such applications would strongly attenuate out-of-band signals while performing little attenuation to in-band signals, operate in high power applications, manage surge conditions present at the device to prevent damage and have a low manufacturing cost.

SUMMARY

A preferred embodiment of the present invention is an electronic filtering device including a printed circuit board for filtering a signal connected to the electronic filtering device. Signals operating outside of the device's designed frequency band are highly attenuated while signals operating within the frequency band experience little attenuation. The electronic filtering device includes a fluid-sealed housing defining a cavity therein for containing the printed circuit board. Two connector assemblies acting as connection terminals are secured to the housing. One connector assembly is connected as an input to the printed circuit board and the other connector assembly is connected as an output to the printed circuit board. Thus, a signal present on one connector assembly can travel through the printed circuit board to the other connector assembly for filtering of the signal. A fluid, such as oil, is disposed in the cavity with the printed circuit board and makes contact with the printed circuit for cooling purposes. Additionally, surge protection elements, such as gas tubes, are integrated with the connector assemblies for dissipating any surges seen at the connector assemblies before the surges can be transmitted through to the printed circuit board.

By positioning the printed circuit board in the cavity of the housing with the cooling fluid, the electronic filtering device can operate with higher power capabilities than traditional filters due to dissipation of the additional heat from the increased voltage or current levels by the cooling fluid. Use of the cooling fluid also helps keep manufacturing costs down since the electronic filtering device can dissipate heat without being substantially expanded in size to accommodate fans or other bulky heat-sink devices coupled to the printed circuit board. Moreover, as power levels increase, surge protection becomes more desirable and the easily serviceable surge protection element integrated into the device protects the filtering circuit from damage, making the electronic filtering device attractive for use in industry.

The electronic filtering device is also easily adaptable to alternative filtering circuits. With both the cooling provisions and the surge protection capabilities separate from the manufacturing or design of the printed circuit board, alternative circuit designs can easily be incorporated onto a printed circuit board for inclusion in the housing without requiring substantial redesign of other components making up the electronic filtering device. This not only allows for the possibility of designing customer-specific filtering circuits for incorporation into the housing at a lower cost, but also allows for alternative circuit product line expansion at lower engineering or manufacturing expense.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Figure 1:
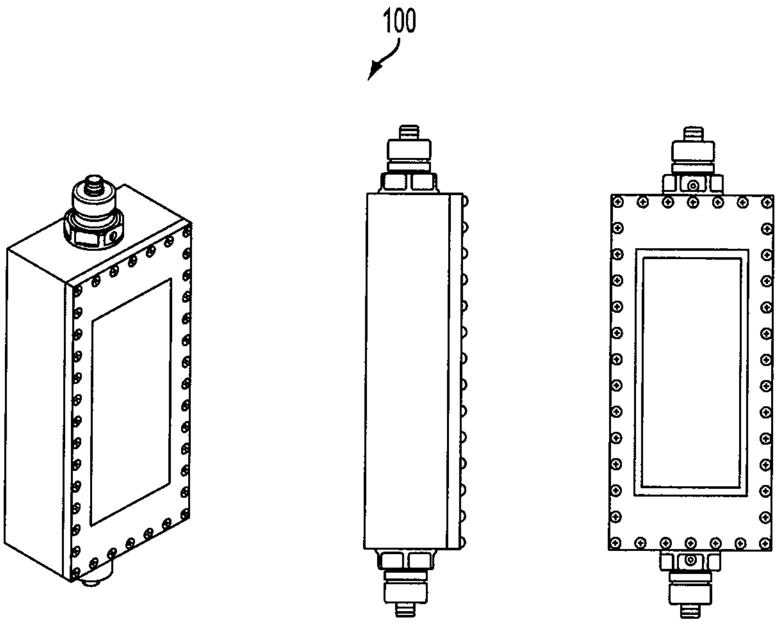
FIG. 1 shows different sealed views of an RF surge protector according to an embodiment of the invention.

Referring now to FIG. 1, a sealed RF surge protector 100 is shown from three perspectives: an angled perspective, a side perspective and a front perspective. The RF surge protector 100 has two connection terminals positioned on a housing of the RF surge protector 100. By connecting a first cable to the first connection terminal and a second cable to the second connection terminal, voltages and currents can flow from the first cable, through the RF surge protector 100 and to the second cable or vice versa. In the preferred embodiment, the housing is approximately 13 inches tall, 6 inches wide and 3.5 inches deep.

Surge conditions at the connection terminals are responded to by dissipating the surge to the housing of the RF surge protector 100, as described in greater detail herein. In this manner, only the desired current and voltage levels are passed between the two connection terminals and helps prevent damage to any filtering components of the RF surge protector 100. The RF surge protector 100 contains various electronic and mechanical parts as part of its manufacturing, these electronic and mechanical parts shown and discussed in greater detail herein.

Figure 2:
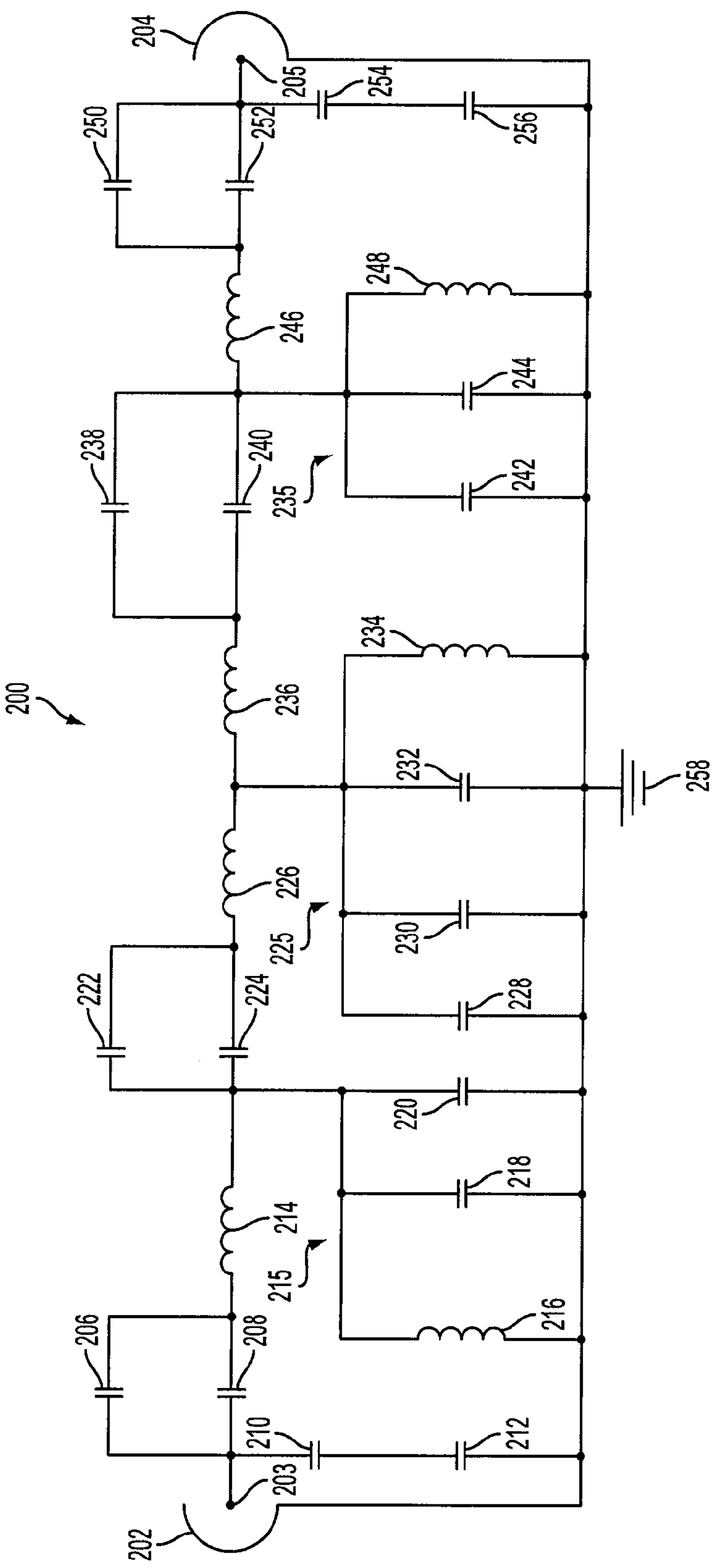
FIG. 2 is a schematic circuit diagram of a high power band pass RF filter according to an embodiment of the invention.

FIG. 2 shows a schematic circuit diagram 200 of a high power band pass RF filter. The band pass filter includes a number of different electrical components, such as capacitors and inductors, attached or mounted to a printed circuit board 313 (see FIG. 3). For illustrative purposes, the schematic circuit diagram 200 will be described with reference to specific capacitance and inductance values to achieve specific RF band pass frequencies of operation and power requirements. However, other specific capacitance and inductance values or configurations may be used to achieve other RF band pass characteristics. Moreover, other electronic filters (e.g., low pass filters, high pass filters or band stop filters) may also be achieved in place of the band pass filter. Characteristics of the band pass circuit described by schematic circuit diagram 200 include an operating frequency range of 160 to 174 MHz, a nominal impedance of 50Ω, an average input power of 200 W, a max peak insertion loss in bandwidth of 1.5 dB, an average insertion loss ripple in bandwidth of 0.7 dB, a max return loss in bandwidth of 17 dB, an operating temperature of −40° C. to 85° C. and a turn-on voltage of ±300V±20%.

An input port 202 and an output port 204 are shown on the left and right sides of the schematic circuit diagram 200. Various components are coupled between the input port 202 and the output port 204. A signal applied at the input port 202 travels through the various components to the output port 204. The schematic circuit diagram 200 can also operate in a bi-directional mode, hence the input port 202 can function as an output port and the output port 204 can function as an input port.

The schematic circuit diagram 200 operates as a high power band pass filter with an operating frequency range between 160 MHz and 174 MHz. Signals outside of this frequency range or pass-band are attenuated. For example, the schematic circuit diagram 200 provides greater than 80 dB of attenuation at 15.4 MHz and greater than 50 dB of attenuation at 1 GHz, as described in greater detail for FIGS. 7 and 8 herein. In addition, the schematic circuit diagram 200 produces sharp roll-offs of signals at the pass-band transitions, which is desirable for band pass filters.

Frequency performance of the schematic circuit diagram 200 includes a desirable high return loss of greater than 20 dB within the operating frequency range of 160 to 174 MHz. Likewise, a desirable low insertion loss of less than 0.4 dB is obtained within the operating frequency range of 160 to 174 MHz. By contrast, for signals at frequencies outside the operating range, the insertion loss is greater than 80 dB at 15.4 MHz and is greater than 50 dB at 1.0 GHz as stated above. Thus, the out-of-band frequencies are highly attenuated.

Turning more specifically to the various components used in the schematic circuit diagram 200, the input port 202 has a center pin 203 connected at an input node of the circuit and the output port 204 has a center pin 205 connected at an output node of the circuit. The connection at the input port 202 and the output port 204 may be a center conductor such as a coaxial line where the center pins 203 and 205 propagate the dc currents and the RF signals and an outer shield surrounds the center pins. The center conductor enables voltages and currents to flow through the circuit. So long as the voltages are below surge protection levels, currents will flow between the input port 202 and the output port 204 and the voltages at each end will be similar. The center pins 203 and 205 also maintain the system RF impedance (e.g., 50Ω, 75Ω, etc.). This configuration is a DC block topology as seen by the series capacitors. By utilizing a different band pass circuit with series inductors and shunt capacitors, a dc pass filter may be achieved. The dc voltage on the center pins 203 and 205 would be used as the operating voltage to power the electronic components that are coupled to the output port 204.

The schematic circuit diagram 200 includes four sets of capacitors (206 and 208, 222 and 224, 238 and 240, 250 and 252). Each of the four sets is placed in a parallel circuit configuration. The four sets of capacitors are used to increase the power handling capabilities of the circuit. For example, the circuit shown by schematic circuit diagram 200 can handle up to 250 watts of power. The capacitors 206, 208, 250 and 252 have values of approximately 120 picoFarads (pF) each. The capacitors 222, 224, 238 and 240 have values of approximately 3.3 picoFarads (pF) each. Additional capacitors are utilized in the schematic circuit diagram 200 for attenuating the out-of-band frequencies or signals. Two sets of series capacitors (210 and 212, 254 and 256) are used for this purpose and have values of approximately 2.2 picoFarads (pF) each.

The schematic circuit diagram 200 also includes four inductors 214, 226, 236 and 246 positioned in series between the input port 202 and the output port 204. The four inductors 214, 226, 236 and 246 are used for in-band tuning of the circuit. The inductors 214 and 246 each have a calculated low inductance value, substantially a short, in-air. The inductors 226 and 236 have calculated values of approximately 200 nanoHenries (nH) each in-air. The above inductor values may substantially change when immersed in oil 315 (see FIG. 3) as opposed to in-air.

Preferably, three tuning sections 215, 225 and 235 are used to tune the band pass stage of the circuit. Additional or fewer tuning sections may be used in an alternative embodiment. The first tuning section 215 includes an inductor 216 and capacitors 218 and 220. The second tuning section 225 includes an inductor 234 and capacitors 228, 230 and 232. The third tuning section 235 includes an inductor 248 and capacitors 242 and 244. The inductors 216, 234 and 248 have calculated values of approximately 100 nanoHenries (nH) each in-air. Similar to the above, the inductor values may be different when immersed in oil 315 (see FIG. 3). The capacitors 218, 220, 230, 242 and 244 have values of approximately 10 picoFarads (pF) each. The capacitors 228 and 232 have values of approximately 27 picoFarads (pF) each. As shown, the three tuning sections 215, 225 and 235 are grounded to a common ground 258, which can be connected to the housing of the RF surge protector 300 (see FIG. 3). In an alternative embodiment, different components or component values may be used to obtain alternative filter characteristics.

Figure 3:
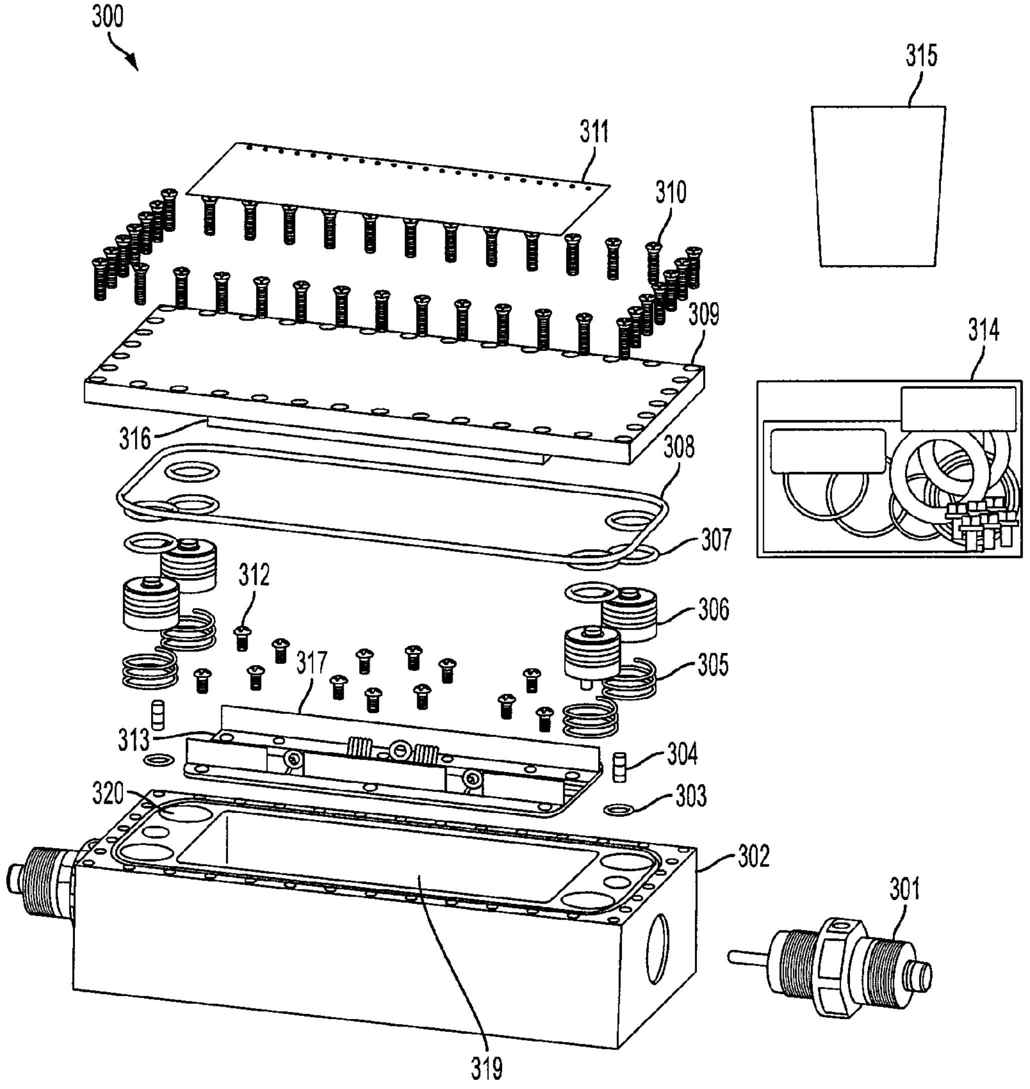
FIG. 3 is a disassembled view of an RF surge protector housing the circuit described in FIG. 2 according to an embodiment of the invention.

Referring now to FIG. 3, a disassembled view of an RF surge protector 300 is shown housing the circuit described in FIG. 2 according to an embodiment of the invention. The RF surge protector 300 has a housing 302 defining a cavity 319. The components shown by schematic circuit diagram 200 (see FIG. 2) are mounted or included on a printed circuit board 313 and the printed circuit board 313 is positioned within the cavity 319. The printed circuit board 313 is fastened to the housing 302 by a plurality of screws 312. In an alternative embodiment, other fasteners may be used to couple the printed circuit board 313 to the housing 302 or no fasteners may be needed.

The printed circuit board 313 electrically connects to a connector assembly 301 secured to a portion of the housing 302. The connector assembly 301 functions as the input port 202 shown on the schematic circuit diagram 200 (see FIG. 2) and as a first connection terminal of the RF surge protector 300. Similarly, another connector assembly 301 secured to a portion of the housing 302 is electrically connected to the printed circuit board 313 and functions as the output port 204 shown on the schematic circuit diagram 200 (see FIG. 2) and as a second connection terminal of the RF surge protector 300. Additional details on the connector assembly 301 are discussed herein for FIG. 4.

One or more walls or sidebars 317 are attached to the printed circuit board 313 and extend in a direction that is perpendicular to a plane defined by the printed circuit board 313. The sidebars 317 are positioned on one or more sides of the printed circuit board 313 and are used to help isolate the RF signals, enhance the grounding of the printed circuit board 313 or provide a larger surface area for dissipation of heat. In one embodiment, the sidebars 317 are about 0.5 inches high and are made of a copper material. In an alternative embodiment, different dimensions, positioning or materials may be used or the sidebars 317 may be omitted completely.

The cavity 319 defined by the housing 302 is filled with an oil 315 for dissipating heat caused by heating of the components (e.g., capacitors and inductors) on the printed circuit board 313. Preferably, the oil 315 is STO-50, a silicon transformer oil. In an alternative embodiment, the oil 315 may be any silicone, mineral, synthetic or other oil, fluid or substance capable of adequately dissipating the heat generated on or by the printed circuit board 313. Preferably, the cavity 319 is filled with approximately 23 ounces of the oil 315 and the oil 315 is capable of reducing the temperature of the components from about 120° C. to about 80° C. The cavity 319 or the housing 302 are completely fluid-sealed in order to contain the oil 315 within the housing 302 without leaking. Preferably, the oil 315 substantially fills the entire cavity 319 in order to completely submerge the printed circuit board 313 in the oil 315. In an alternative embodiment, the cavity 319 may be filled with different volumes of the oil 315.

The RF surge protector 300 includes one or more cylindrical cavities 320 in the housing 302 for the placement of piston springs 305 and pistons 306 that are coupled with O-rings 307 to aid in sealing. In an alternative embodiment, other shapes for the cavities 320 may be used. The piston springs 305 and pistons 306 allow the oil 315 to expand and are used to exert a constant pressure within the cavity 319 when a cover 309 is attached to the housing 302. The cover 309 is sealed with the housing 302 using an O-ring 308 and a plurality of cover screws 310. The piston springs 305 and pistons 306 are sealed from the oil 315 using O-rings 307. Alternatively, the one or more cylindrical cavities 320 can be used as overflow cavities for any excess oil 315 from the cavity 319 due to heating and expanding of the oil 315. O-rings 303 and additional openings in the housing 302 for containing set screws 304 help secure the connector assembly 301 to the housing 302.

The RF surge protector 300 preferably includes a closed cell foam material 316 attached to a surface of the cover 309 to disrupt the oil's dielectric constant and keep high frequency out-of-band signals from reflecting within the cavity 319 causing signal interferences. The foam material 316 is sized to cover the entire opening formed by the cavity 319. The RF surge protector 300 also includes a label 311 attached to the cover 309 with identification, electrical, mechanical, safety or other information or parameters pertaining to the RF surge protector 300. In addition, a hardware kit 314 is shown with various parts used in the assembly of the RF surge protector 300 to allow for parts replacement.

Figure 4:
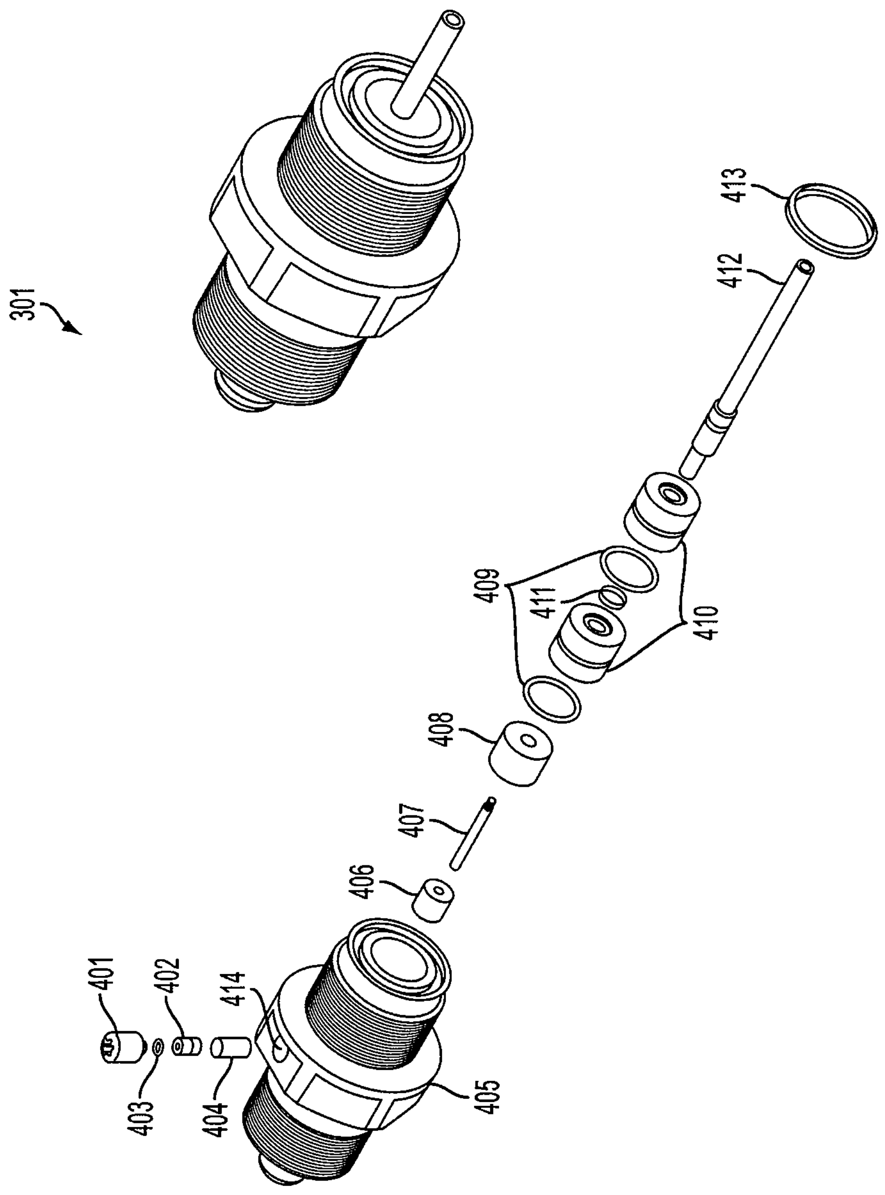
FIG. 4 is a disassembled view of a connector assembly according to an embodiment of the invention.

FIG. 4 shows a disassembled view of the connector assembly 301 discussed in FIG. 3 according to an embodiment of the invention. One connector assembly 301 is attached to each end of the housing 302 as described above (see FIG. 3). The connector assembly 301 has a conductive element or center pin 412 extending from one end of the connector assembly 301, the center pin 412 connecting to the printed circuit board 313 (see FIG. 3) either as the input center pin 203 or the output center pin 205 depending upon whether the connector assembly 301 is connected as the input port 202 or the output port 204 (see FIG. 2). Preferably, the center pin 412 is electrically connected to the printed circuit board 313 via a solder connection.

The connector assembly 301 includes a connector housing 405 defining a connector cavity 414. A gas tube 402 is positioned within a non-conductive tube 404 (e.g., a plastic or PTFE tube) and both are positioned within the connector cavity 414 of the connector housing 405. The gas tube 402 is secured in the connector cavity 414 with a gas tube retaining screw 401 and a washer 403. The non-conductive tube 404 isolates a portion of the gas tube 402 from the connector housing 405 to prevent shorting to ground or unintended contact between the portion of the gas tube 402 and the connector housing 405 (e.g., ground). The gas tube 402 is integrated into the connector housing 405 and does not come into contact with the oil 315 contained within the housing 302 (see FIG. 3). In one embodiment, the gas tube 402 is a three-terminal, dual-chambered device wherein each chamber has a breakdown voltage of approximately 150 volts, each chamber being used serially and thus additive to 300 volts. This serial arrangement puts the capacitances inherent in the gas tube 402 in series, resulting in lower total capacitance and thus better RF performance. In an alternative embodiment, a different gas tube 402 or configuration may be used or determined from transmit power requirements.

When the gas tube 402 is within the connector cavity 414, the gas tube electrically connects with the center pin 412 for dissipating surge conditions present on the center pin 412 through the gas tube 402 and to the connector housing 405. In an alternative embodiment, other surge protection elements may be used in place of or in addition to the gas tube 402 for dissipating a surge present upon the center pin 412. The center pin 412 is integrated with the connector assembly 301 by engaging with an internal pin 407 and coupled with a plurality of inserts (406, 408 and 410) and a plurality of O-rings (409, 411 and 413). Preferably, insert 406 is made of Teflon and inserts 408 and 410 are made of PTFE. In an alternative embodiment, other materials may be used.

Figure 5:
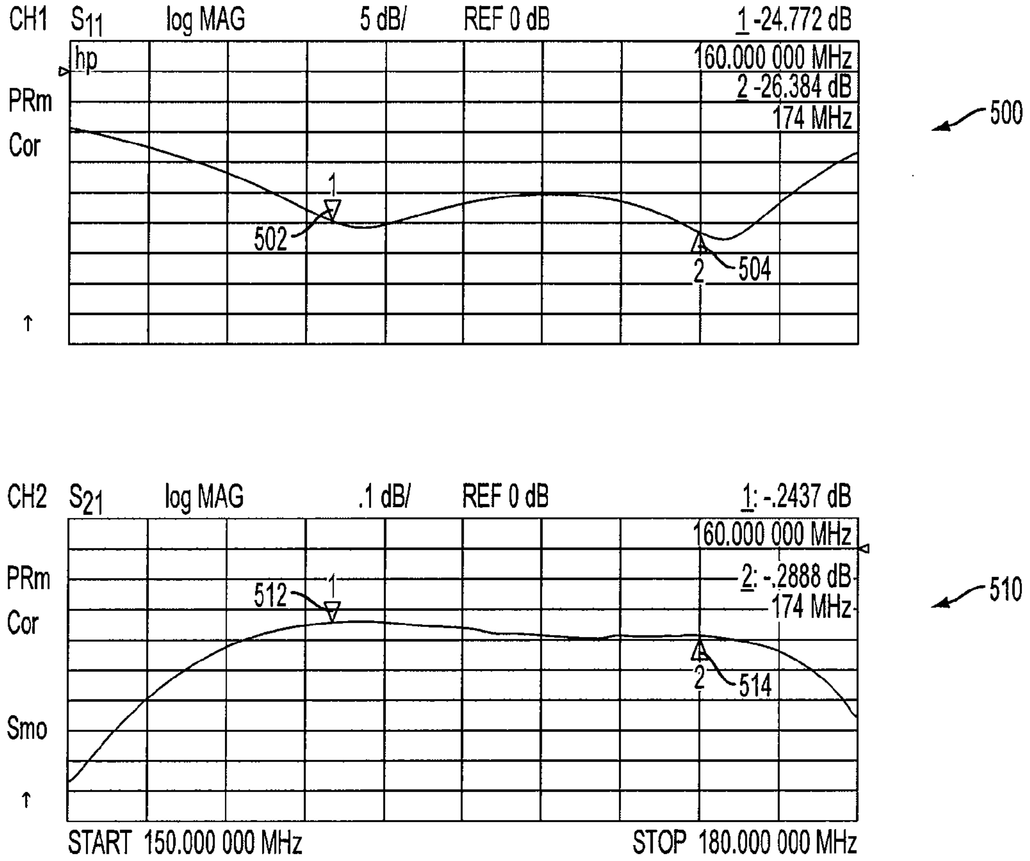
FIG. 5 is a top graph of the input in-band return loss and a bottom graph of the input in-band insertion loss of the RF surge protector of FIG. 3 according to an embodiment of the invention.
Figure 6:
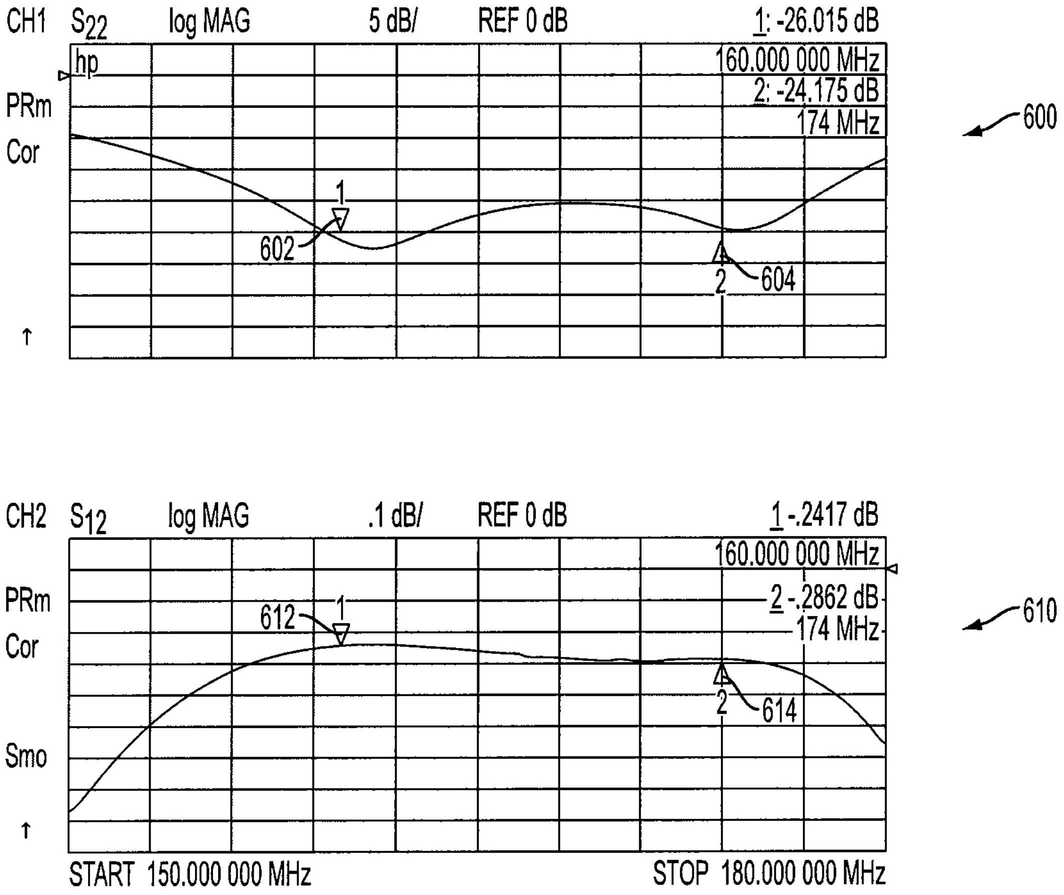
FIG. 6 is a top graph of the output in-band return loss and a bottom graph of the output in-band insertion loss of the RF surge protector of FIG. 3 according to an embodiment of the invention.

Referring now to FIG. 5 and FIG. 6, graphs are displayed showcasing in-band operating characteristics of the input and the output of the circuit shown by schematic circuit diagram 200. Graph 500 (see FIG. 5) shows the input in-band return loss and graph 600 (see FIG. 6) shows the output in-band return loss. For signals operating at frequencies within the pass-band of the filter shown by schematic circuit diagram 200, a high return loss (e.g., at least 20 dB) is desirable. The circuit shown by schematic circuit diagram 200 has been configured for an operating frequency range of 160 to 174 MHz as described above for FIG. 2. Input data-point 502 (see FIG. 5) indicates around 25 dB of return loss at 160 MHz. Input data-point 504 (see FIG. 5) indicates around 26 dB of return loss at 174 MHz. Similarly, output data-point 602 (see FIG. 6) indicates around 26 dB of return loss at 160 MHz and output data-point 604 (see FIG. 6) indicates around 24 dB of return loss at 174 MHz.

For signals operating at frequencies within the pass-band of the filter shown by schematic circuit diagram 200, a low insertion loss (e.g., less than 0.4 dB) is also desirable for limiting the attenuation of pass-band signals. Graph 510 (see FIG. 5) shows the input in-band insertion loss and graph 610 (see FIG. 6) shows the output in-band insertion loss. Input data-point 512 (see FIG. 5) indicates around 0.24 dB of insertion loss at 160 MHz. Input data-point 514 (see FIG. 5) indicates around 0.29 dB of insertion loss at 174 MHz. Similarly, output data-point 612 (see FIG. 6) indicates around 0.24 dB of insertion loss at 160 MHz and output data-point 614 (see FIG. 6) indicates around 0.29 dB of insertion loss at 174 MHz.

Figure 7:
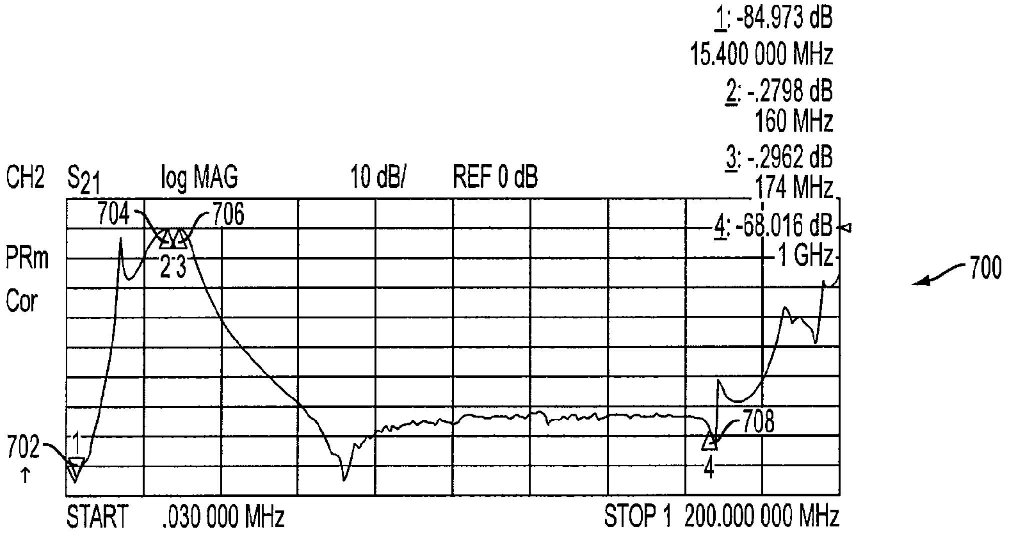
FIG. 7 is a graph of the input out-of-band insertion loss of the RF surge protector of FIG. 3 according to an embodiment of the invention.
Figure 8:
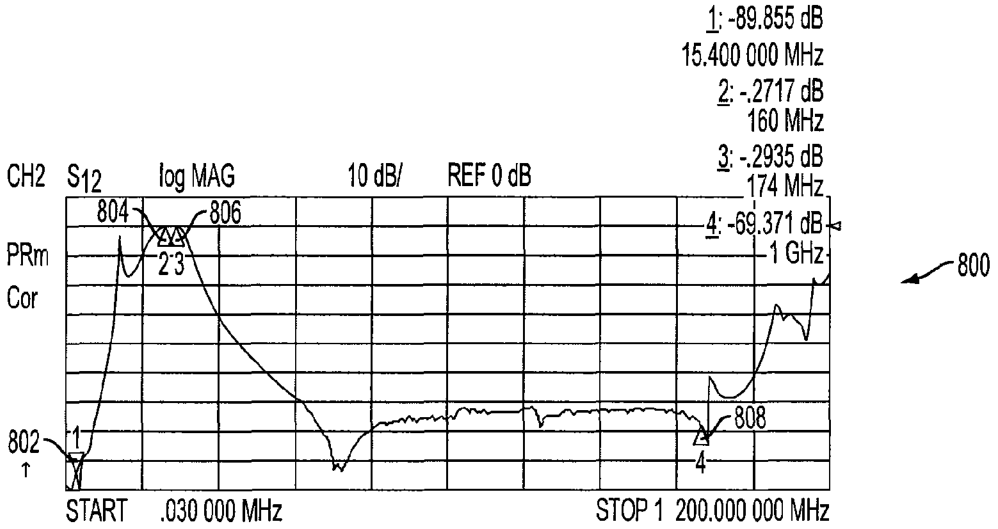
FIG. 8 is a graph of the output out-of-band insertion loss of the RF surge protector of FIG. 3 according to an embodiment of the invention.

FIG. 7 and FIG. 8 display graphs showcasing out-of-band operating characteristics of the input and the output of the circuit shown by schematic circuit diagram 200. Since the circuit shown by schematic circuit diagram 200 has been configured for an operating frequency range of 160 to 174 MHz, data-points at frequencies outside that pass-band are chosen for examples of out-of-band insertion loss. A high insertion loss (e.g., at least 50 dB) is desirable for out-of-band signals since out-of-band signals are to be highly attenuated.

Graph 700 (see FIG. 7) shows the input out-of-band insertion loss and graph 800 (see FIG. 8) shows the output out-of-band insertion loss. Input data-point 702 (see FIG. 7) indicates around 85 dB of insertion loss at 15.4 MHz. Input data-point 708 (see FIG. 7) indicates around 68 dB of insertion loss at 1 GHz. Similarly, output data-point 802 (see FIG. 8) indicates around 90 dB of insertion loss at 15.4 MHz and output data-point 808 (see FIG. 8) indicates around 69 dB of insertion loss at 1 GHz. As described above for FIG. 5 and FIG. 6, in-band insertion loss for input and output signals with frequencies of 160 to 174 MHz is low as shown by input data-points 704 and 706 (see FIG. 7) and output data-points 804 and 806 (see FIG. 8).

Figure 9:
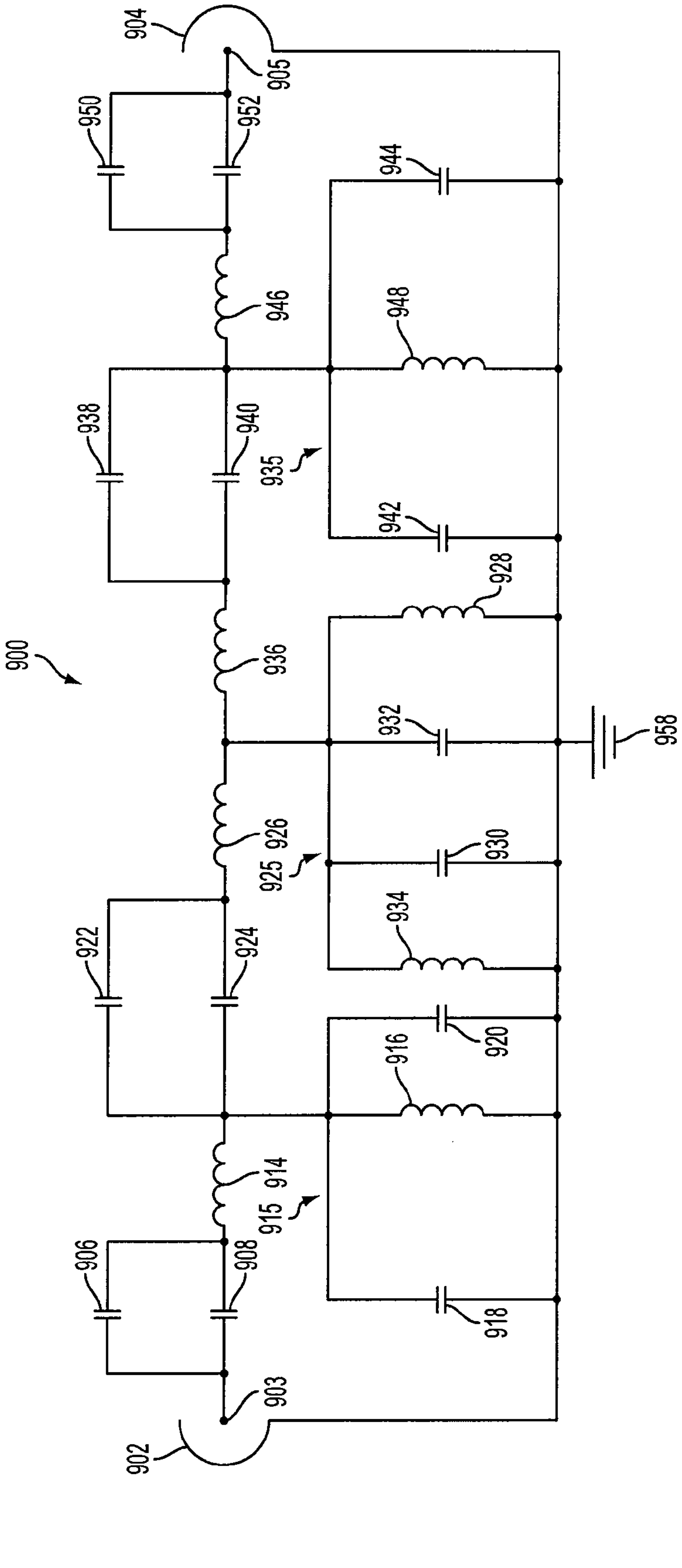
FIG. 9 is an alternative schematic circuit diagram of a high power band pass RF filter according to an embodiment of the invention.

Turning now to FIG. 9, an alternate schematic circuit diagram 900 of a high power band pass RF filter is shown. Similar to FIG. 2, the band pass filter of schematic circuit diagram 900 includes a number of different electrical components, such as capacitors and inductors that are mounted or included on a printed circuit board 1013 (see FIG. 10). For illustrative purposes, the schematic circuit diagram 900 will be described with reference to specific capacitance and inductance values to achieve specific RF band pass frequencies of operation and power requirements. However, other specific capacitance and inductance values and configurations may be used to achieve other RF band pass characteristics. The circuit described by schematic circuit diagram 900 has an operating frequency range of 225 to 400 MHz, a nominal impedance of 50Ω, an average input power of 250 W, a max peak insertion loss in bandwidth of 1.5 dB, an average insertion loss ripple in bandwidth of 0.7 dB, a max return loss in bandwidth of 14 dB, an operating temperature of −40° C. to 85° C. and a turn-on voltage of ±300V±20%.

An input port 902 and an output port 904 are shown on the left and right sides of the schematic circuit diagram 900. Various components are coupled between the input port 902 and the output port 904. A signal applied at the input port 902 travels through the various components to the output port 904. The schematic circuit diagram 900 can also operate in a bi-directional mode, hence the input port 902 can function as an output port and the output port 904 can function as an input port.

The schematic circuit diagram 900 operates as a high power band pass filter with an operating frequency range between 225 MHz and 400 MHz. Signals outside of this frequency range or pass-band are highly attenuated. For example, the schematic circuit diagram 900 provides greater than 80 dB of attenuation at 10 MHz and greater than 40 dB of attenuation at 1 GHz, as described in greater detail for FIGS. 13 and 14 herein. In addition, the schematic circuit diagram 900 produces sharp roll-offs of signals at the pass-band transitions, which is desirable for band pass filters.

Frequency performance of the schematic circuit diagram 900 includes a desirable high return loss of greater than 17 dB within the operating frequency range of 225 to 400 MHz. Likewise, a preferably low insertion loss of less than or equal to 0.4 dB is obtained within the operating frequency range of 225 to 400 MHz. By contrast, for signals at frequencies outside the operating range, the insertion loss is greater than 80 dB at 10 MHz and is greater than 40 dB at 1 GHz as stated above. Thus, the out-of-band frequencies are highly attenuated.

Turning more specifically to the various components used in the schematic circuit diagram 900, the input port 902 has a center pin 903 connected at an input node of the circuit and the output port 904 has a center pin 905 connected at an output node of the circuit. The connection at the input port 902 and the output port 904 may be a center conductor such as a coaxial line where the center pins 903 and 905 propagate the dc currents and the RF signals and an outer shield surrounds the center pins. The center conductor enables voltages and currents to flow through the circuit. So long as the voltages are below surge protection levels, currents will flow between the input port 902 and the output port 904 and the voltages at each end will be similar. The center pins 903 and 905 also maintain the system RF impedance (e.g., 50Ω, 75Ω, etc.). This configuration is a DC block topology as seen by the series capacitors. By utilizing a different band pass circuit with series inductors and shunt capacitors, a dc pass filter may be achieved. The dc voltage on the center pins 903 and 905 would be used as the operating voltage to power the electronic components that are coupled to the output port 904.

The schematic circuit diagram 900 includes four sets of capacitors (906 and 908, 922 and 924, 938 and 940, 950 and 952). Each of the four sets is placed in a parallel circuit configuration. The four sets of capacitors are used to increase the power handling capabilities of the circuit. For example, the circuit shown by schematic circuit diagram 900 can handle up to 250 watts of power. The capacitors 906, 908, 950 and 952 have values of approximately 12 picoFarads (pF) each. The capacitors 922, 924, 938 and 940 have values of approximately 8.2 picoFarads (pF) each.

The schematic circuit diagram 900 also includes four inductors 914, 926, 936 and 946 positioned in series between the input port 902 and the output port 904. The four inductors 914, 926, 936 and 946 are used for in-band tuning of the circuit. The inductors 914, 926, 936 and 946 have calculated values of approximately 15 nanoHenries (nH) each in-air. The above inductor values may substantially change when immersed in oil 315 (see FIG. 10) as opposed to in-air.

Preferably, three tuning sections 915, 925 and 935 are used to tune the band-pass stage of the circuit. Additional or fewer tuning sections may be used in an alternative embodiment. The first tuning section 915 includes an inductor 916 and capacitors 918 and 920. The second tuning section 925 includes inductors 934 and 928 and capacitors 930 and 932. The third tuning section 935 includes an inductor 948 and capacitors 942 and 944. The inductors 916 and 948 have calculated values of approximately 75 nanoHenries (nH) each in-air. The inductor 934 has a calculated value of approximately 100 nanoHenries (nH) in-air. The inductor 928 has a calculated value of approximately 15 nanoHenries (nH) in-air. Similar to the above, the inductor values may be different when immersed in oil 315 (see FIG. 10). The capacitors 918, 920, 942 and 944 have values of approximately 2.2 picoFarads (pF) each. The capacitors 930 and 932 have values of approximately 8.2 picoFarads (pF) each. As shown, the three tuning sections 915, 925 and 935 are grounded to a common ground 958, which can be connected to the housing of the RF surge protector 1000 (see FIG. 10). In an alternative embodiment, different components or component values may be used to obtain different band-pass characteristics.

Figure 10:
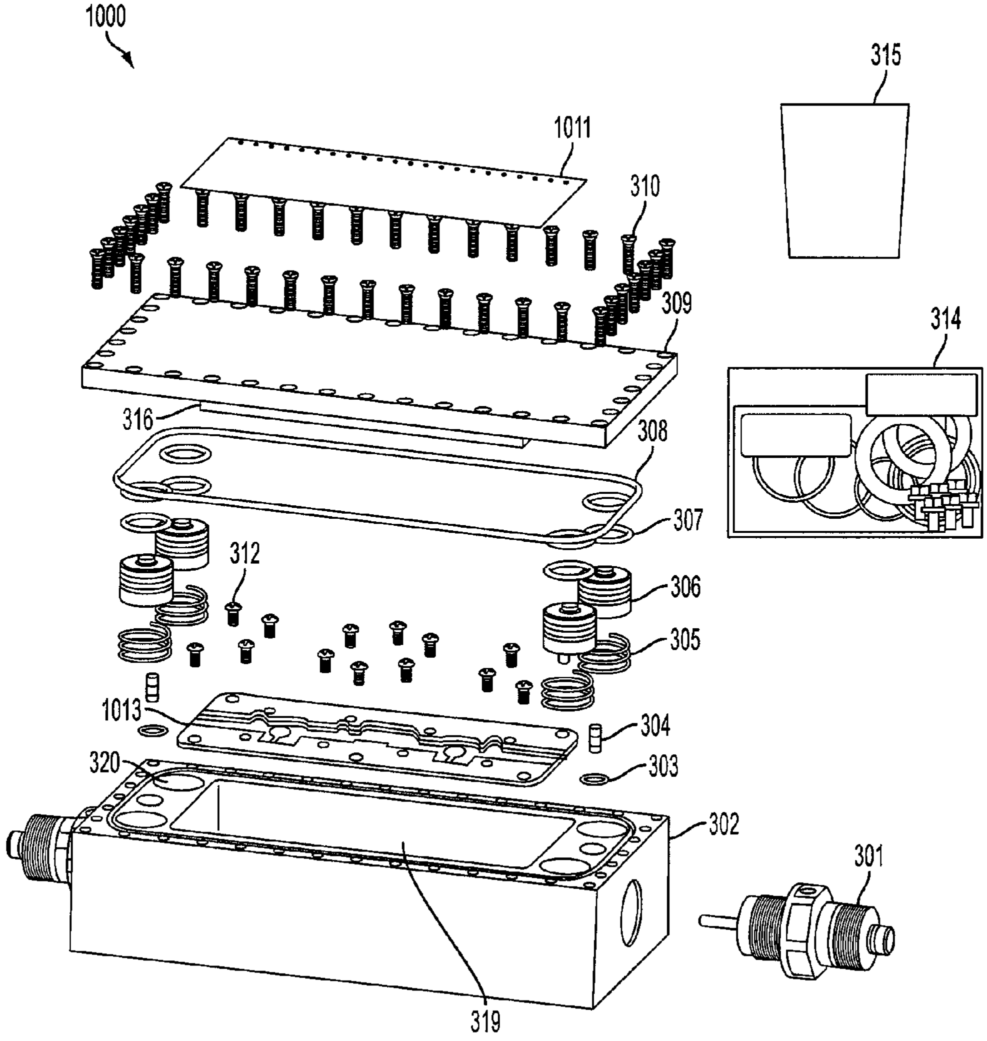
FIG. 10 is a disassembled view of an RF surge protector housing the circuit described in FIG. 9 according to an embodiment of the invention.

Referring now to FIG. 10, a disassembled view of an RF surge protector 1000 is shown housing the circuit described in FIG. 9 according to an embodiment of the invention. The RF surge protector 1000 is similar in construction to the RF surge protector 300 described in FIG. 3 and utilizes many of the same component parts. The RF surge protector 1000 includes the housing 302 defining the cavity 319. The components shown by schematic circuit diagram 900 (see FIG. 9) are mounted or included on a printed circuit board 1013 and the printed circuit board 1013 is positioned within the cavity 319. The printed circuit board 1013 is fastened to the housing 302 by the plurality of screws 312. In an alternative embodiment, other fasteners may be used to couple the printed circuit board 1013 to the housing 302 or no fasteners may be needed.

The printed circuit board 1013 electrically connects to the connector assembly 301 secured to a portion of the housing 302. The connector assembly 301 functions as the input port 902 shown on the schematic circuit diagram 900 (see FIG. 9) and as the first connection terminal of the RF surge protector 1000. Similarly, another connector assembly 301 secured to a portion of the housing 302 is electrically connected to the printed circuit board 1013 and functions as the output port 904 shown on the schematic circuit diagram 900 (see FIG. 9) and as the second connection terminal of the RF surge protector 1000.

The cavity 319 defined by the housing 302 is filled with the oil 315 for dissipating heat caused by heating of the components (e.g., capacitors and inductors) on the printed circuit board 1013. Preferably, the oil 315 is STO-50, a silicon transformer oil. In an alternative embodiment, the oil 315 may be any silicone, mineral, synthetic or other oil, fluid or substance capable of adequately dissipating the heat generated on the printed circuit board 1013. Preferably, the cavity 319 is filled with approximately 23 ounces of the oil 315 and the oil 315 is capable of reducing the temperature of the components from about 120° C. to about 80° C. The cavity 319 or the housing 302 are completely fluid-sealed in order to contain the oil 315 within the housing 302 without leaking. Preferably, the oil 315 substantially fills the entire cavity 319 in order to completely submerge the printed circuit board 1013 in the oil 315. In an alternative embodiment, the cavity 319 may be filled with different volumes of the oil 315.

The RF surge protector 1000 includes one or more cylindrical cavities 320 in the housing 302 for the placement of piston springs 305 and pistons 306 that are coupled with O-rings 307 to aid in sealing. In an alternative embodiment, other shapes for the cavities 320 may be used. The piston springs 305 and pistons 306 allow the oil 315 to expand and are used to exert a constant pressure within the cavity 319 when a cover 309 is attached to the housing 302. The cover 309 is sealed with the housing 302 using an O-ring 308 and a plurality of cover screws 310. The piston springs 305 and pistons 306 are sealed from the oil 315 using O-rings 307. Alternatively, the one or more cylindrical cavities 320 can be used as overflow cavities for any excess oil 315 from the cavity 319 due to heating and expanding of the oil 315. O-rings 303 and additional openings in the housing 302 for containing set screws 304 help secure the connector assembly 301 to the housing 302.

The RF surge protector 1000 preferably includes a closed cell foam material 316 attached to an inner surface of the housing 302 to disrupt the oil's dielectric constant and keep high frequency out-of-band signals from reflecting within the cavity 319 causing signal interferences. The foam material 316 is sized to cover the entire opening formed by the cavity 319. The RF surge protector 1000 also includes a label 1011 attached to the cover 309 with identification, electrical, mechanical, safety or other information or parameters pertaining to the RF surge protector 1000. In addition, a hardware kit 314 is shown with various parts used in the assembly of the RF surge protector 1000 to allow for parts replacement.

Figure 11:
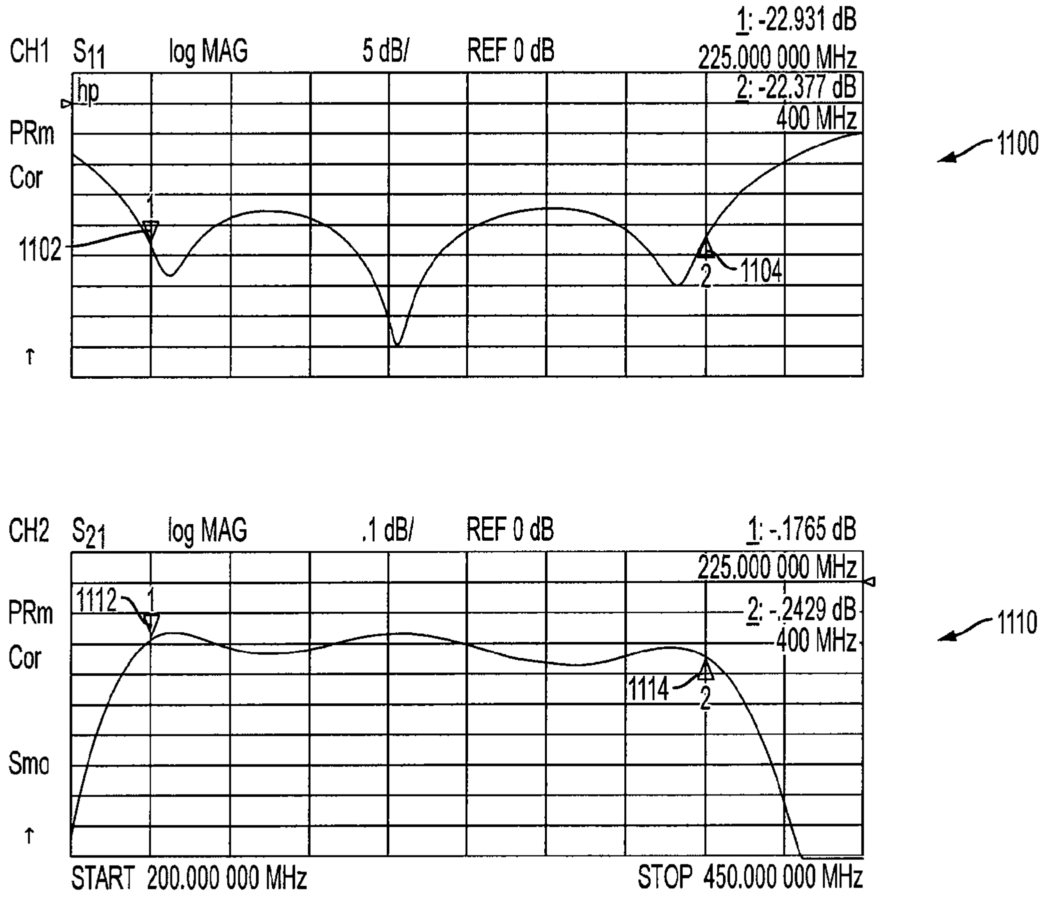
FIG. 11 is a top graph of the input in-band return loss and a bottom graph of the input in-band insertion loss of the RF surge protector of FIG. 10 according to an embodiment of the invention.
Figure 12:
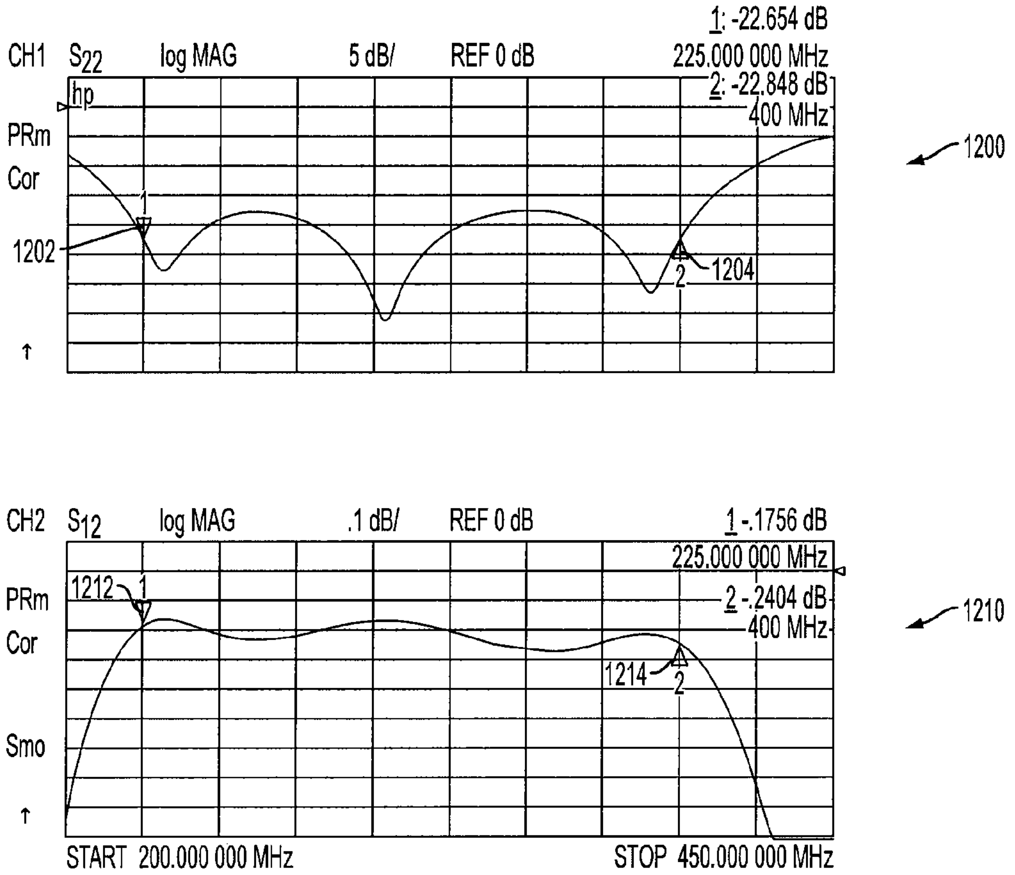
FIG. 12 is a top graph of the output in-band return loss and a bottom graph of the output in-band insertion loss of the RF surge protector of FIG. 10 according to an embodiment of the invention.

Referring now to FIG. 11 and FIG. 12, graphs are displayed showcasing in-band operating characteristics of the input and the output of the circuit shown by schematic circuit diagram 900. Graph 1100 (see FIG. 11) shows the input in-band return loss and graph 1200 (see FIG. 12) shows the output in-band return loss. For signals operating at frequencies within the pass-band of the filter shown by schematic circuit diagram 900, a high return loss (e.g., at least 17 dB) is desirable. The circuit shown by schematic circuit diagram 900 has been configured for an operating frequency range of 225 to 400

MHz as described above for FIG. 9. Input data-point 1102 (see FIG. 11) indicates around 23 dB of return loss at 225 MHz. Input data-point 1104 (see FIG. 11) indicates around 22 dB of return loss at 400 MHz. Similarly, output data-point 1202 (see FIG. 12) indicates around 23 dB of return loss at 225 MHz and output data-point 1204 (see FIG. 12) indicates around 23 dB of return loss at 400 MHz.

For signals operating at frequencies within the pass-band of the filter shown by the circuit shown in schematic circuit diagram 900 (see FIG. 9), a low insertion loss (e.g., less than or equal to 0.4 dB) is also desirable to limit the attenuation of pass-band signals. Graph 1110 (see FIG. 11) shows the input in-band insertion loss and graph 1210 (see FIG. 12) shows the output in-band insertion loss. Input data-point 1112 (see FIG. 11) indicates around 0.18 dB of insertion loss at 225 MHz. Input data-point 1114 (see FIG. 11) indicates around 0.24 dB of insertion loss at 400 MHz. Similarly, output data-point 1212 (see FIG. 12) indicates around 0.18 dB of insertion loss at 225 MHz and output data-point 1214 (see FIG. 12) indicates around 0.24 dB of insertion loss at 400 MHz.

Figure 13:
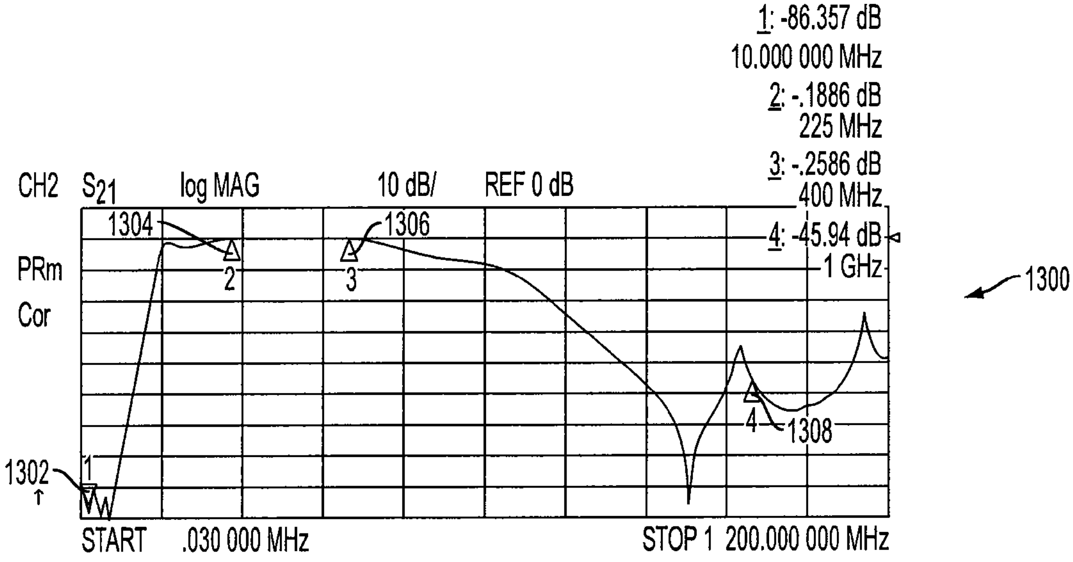
FIG. 13 is a graph of the input out-of-band insertion loss of the RF surge protector of FIG. 10 according to an embodiment of the invention.
Figure 14:
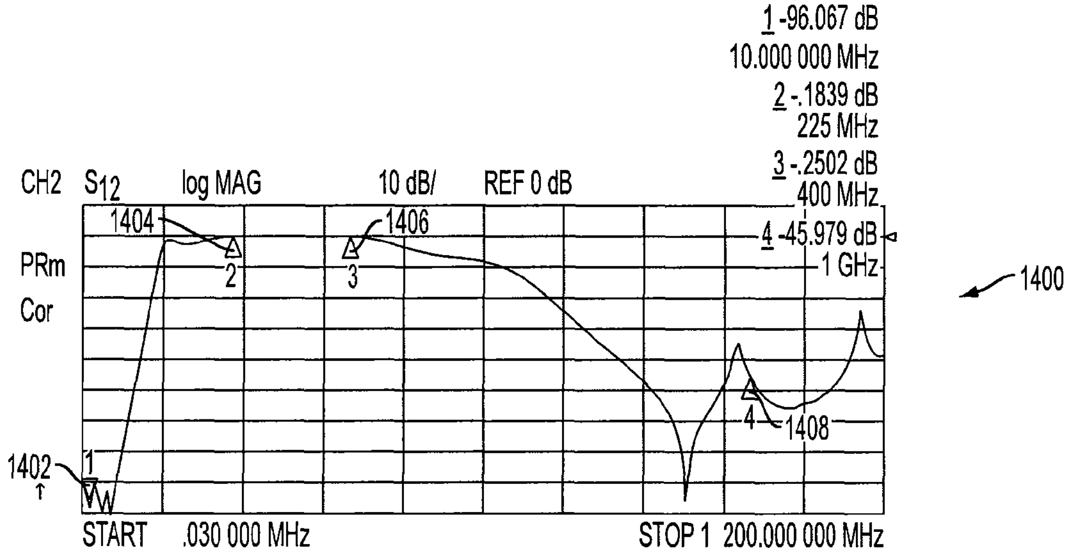
FIG. 14 is a graph of the output out-of-band insertion loss of the RF surge protector of FIG. 10 according to an embodiment of the invention.

FIG. 13 and FIG. 14 display graphs showcasing out-of-band operating characteristics of the input and the output of the circuit shown by schematic circuit diagram 900. Since the circuit shown by schematic circuit diagram 900 has been configured for an operating frequency range of 225 to 400 MHz, data-points at frequencies outside that pass-band are chosen for examples of out-of-band insertion loss. A high insertion loss (e.g., at least 40 dB) is desirable for out-of-band signals since out-of-band signals are to be highly attenuated.

Graph 1300 (see FIG. 13) shows the input out-of-band insertion loss and graph 1400 (see FIG. 14) shows the output out-of-band insertion loss. Input data-point 1302 (see FIG. 13) indicates around 86 dB of insertion loss at 10 MHz. Input data-point 1308 (see FIG. 13) indicates around 46 dB of insertion loss at 1 GHz. Similarly, output data-point 1402 (see FIG. 14) indicates around 96 dB of insertion loss at 10 MHz and output data-point 1408 (see FIG. 14) indicates around 46 dB of insertion loss at 1 GHz. As described above for FIG. 11 and FIG. 12, in-band insertion loss for input and output signals with frequencies of 225 to 400 MHz is low as shown by input data-points 1304 and 1306 (see FIG. 13) and output data-points 1404 and 1406 (see FIG. 14).

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An electronic filtering device comprising:

a fluid-sealed housing defining a cavity therein;

a printed circuit board positioned within the cavity;

a fluid disposed within the cavity, the fluid contacting the printed circuit board for cooling the printed circuit board;

a connector assembly coupled to the housing, the connector assembly having a conductive element electrically connected to the printed circuit board; and a surge protection element electrically connected between the conductive element and the housing.

2. The electronic filtering device of claim 1 wherein the connector assembly comprises a coaxial line having a center pin as the conductive element that propagates dc currents and RF signals and an outer shield that surrounds the center pin.

3. The electronic filtering device of claim 1 wherein the connector assembly further comprises a connector housing and wherein a portion of the surge protection element is disposed within the connector housing.

4. The electronic filtering device of claim 1 wherein the surge protection element is a gas tube.

5. The electronic filtering device of claim 1 wherein the fluid is a silicon transformer oil or a mineral oil.

6. The electronic filtering device of claim 1 further comprising a sidebar coupled to the printed circuit board.

7. The electronic filtering device of claim 1 further comprising a foam material coupled to the housing for reducing reflection of RF signals within the cavity of the housing.

8. A high power band pass RF filtering apparatus for the filtering of electronic signals, the apparatus comprising:

a sealed housing defining a cavity therein, the sealed housing configured to prevent a leaking of fluid to outside of the housing;

a printed circuit board positioned within the cavity and coupled to the housing;

an oil disposed within the cavity and contacting the printed circuit board for dissipating heat from the printed circuit board;

a connector assembly having a center pin electrically connected to the printed circuit board, the connector assembly secured to the housing and configured to provide an electrical connection from outside the housing to the printed circuit board within the cavity of the housing; and a surge protection element integrated with the connector assembly, the surge protection element electrically connected between the center pin of the connector assembly and the housing.

9. The high power band pass RF filtering apparatus of claim 8 wherein the oil is configured to dissipate heat from the printed circuit board from around 120° C. to around 80° C.

10. The high power band pass RF filtering apparatus of claim 8 wherein the oil substantially fills the cavity of the housing.

11. The high power band pass RF filtering apparatus of claim 8 further comprising a sidebar coupled to the printed circuit board, the sidebar positioned substantially perpendicular to a plane defined by the printed circuit board.

12. The high power band pass RF filtering apparatus of claim 11 wherein the sidebar is about 0.5 inches high and made of a copper material.

13. The high power band pass RF filtering apparatus of claim 8 further comprising a second cavity defined by the housing, the second cavity in fluid communication with the cavity of the housing for allowing the oil to overflow from the cavity to the second cavity.

14. The high power band pass RF filtering apparatus of claim 13 further comprising a piston positioned in the second cavity for exerting pressure on the oil when the oil overflows to the second cavity.

15. The high power band pass RF filtering apparatus of claim 8 wherein the surge protection element is a dual-chambered gas tube, each chamber of the dual-chambered gas tube having a breakdown voltage of about 150 volts.

16. A high power band pass RF filtering apparatus with surge protection for the attenuation of frequencies outside of a pass-band, the high power band pass RF filtering apparatus comprising:

a housing defining a cavity therein, the housing adapted to prevent a leaking of fluid from within the cavity to outside of the housing;

a printed circuit board positioned within the cavity and coupled to the housing, the printed circuit board having an input node and an output node;

an oil disposed within the cavity and substantially filling the cavity, the oil submerging the printed circuit board for dissipating heat from the printed circuit board;

a foam material positioned within the cavity and attached to a portion of the housing;

an input connector assembly secured to the housing and having an input center pin, a portion of the input center pin positioned within the cavity of the housing and electrically connected to the input node of the printed circuit board;

an output connector assembly secured to the housing and having an output center pin, a portion of the output center pin positioned within the cavity of the housing and electrically connected to the output node of the printed circuit board;

an input gas tube integrated with the input connector assembly for surge protection, the input gas tube electrically connected between the input center pin and the housing; and an output gas tube integrated with the output connector assembly for surge protection, the output gas tube electrically connected between the output center pin and the housing.

17. The high power band pass RF filtering apparatus of claim 16 wherein:

a portion of the input connector assembly is positioned outside of the housing; and a portion of the output connector assembly is positioned outside of the housing.

18. The high power band pass RF filtering apparatus of claim 16 wherein the pass-band of the filtering apparatus is about 160 to 174 MHz.

19. The high power band pass RF filtering apparatus of claim 16 wherein the pass-band of the filtering apparatus is about 225 to 400 MHz.

20. The high power band pass RF filtering apparatus of claim 16 wherein the oil is completely contained within the housing.

* * * * *